United States Patent [19]

Nakagawa et al.

[11] 4,232,335
[45] Nov. 4, 1980

[54] NUMERICAL CONTROL TAPE PREPARATION MACHINE

[75] Inventors: Hiroshi Nakagawa, Katano; Hidetoshi Kawa, Ibaragi; Makoto Kawai, Yahata, all of Japan

[73] Assignee: Matsushita Electric Industrial Co., Ltd., Osaka, Japan

[21] Appl. No.: 869,259

[22] Filed: Jan. 13, 1978

[30] Foreign Application Priority Data

Jan. 18, 1977 [JP] Japan ............................ 52-4581

[51] Int. Cl.³ .............................................. H04N 7/18
[52] U.S. Cl. ............................... 358/101; 346/33 MC; 350/10; 358/903
[58] Field of Search ................. 358/93, 101, 107, 903, 358/106; 346/33 MC; 350/10

[56] References Cited

U.S. PATENT DOCUMENTS

| | | | |
|---|---|---|---|
| T945,006 | 4/1976 | Speck et al. | 358/93 |
| 3,459,145 | 8/1969 | Ramsey et al. | 346/33 MC |
| 3,471,213 | 10/1969 | Back | 350/10 |
| 3,541,243 | 11/1970 | Whitsel | 358/101 |
| 4,028,728 | 6/1977 | Sharp | 358/106 |
| 4,051,534 | 9/1977 | Dykich et al. | 358/93 |
| 4,089,608 | 5/1978 | Hoadley | 358/106 |
| 4,790,704 | 2/1974 | Collomosse et al. | 358/101 |

OTHER PUBLICATIONS

Cathode Press—vol. 17, #2—Jun. 1960—p. 32.
Duffy et al.—Automatic CCTV Positioning System—IBM Tech. Disclosure Bulletin—vol. 14, No. 8, Jan. 1972.

Primary Examiner—Robert L. Griffin
Assistant Examiner—Joseph A. Orsino, Jr.
Attorney, Agent, or Firm—Burgess, Ryan and Wayne

[57] ABSTRACT

A memory device is provided for measuring the displacements of a table movable in two directions mutually perpendicular to each other and storing the displacements. In case of the measurement of table positioning data, the data measurement may be made without stopping a part insertion machine and keeping the continuous operation of the machine. Conditions under which positioning of part insertion apertures is made are judged from the enlarged insertion apertures displayed on a television monitor so that better workability may be attained, an operator feels no fatigue and correct positioning may be accomplished, whereby a numerical control tape having correct positioning information recorded thereon may be prepared.

5 Claims, 9 Drawing Figures

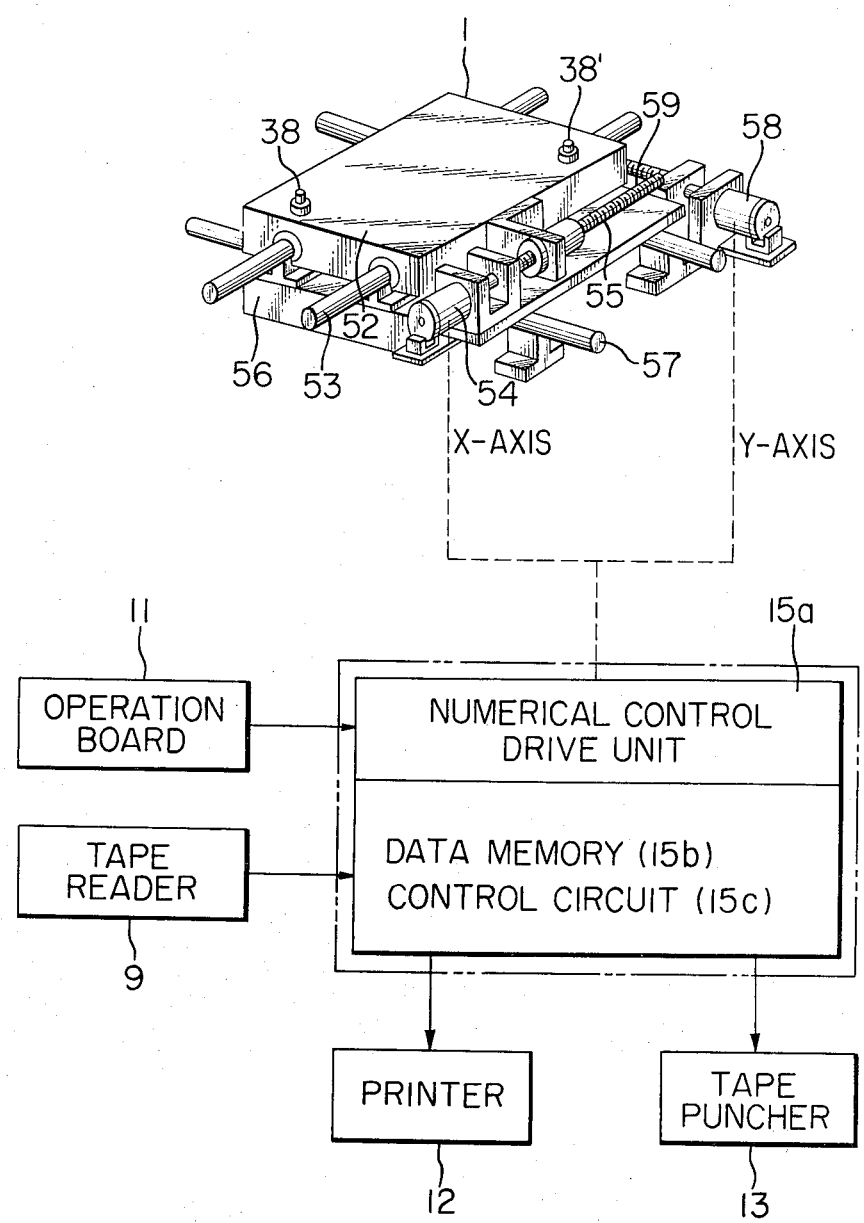

NUMERICAL CONTROL TAPE PREPARATION MACHINE

BACKGROUND OF THE INVENTION

The present invention relates to a numerical control tape preparation machine wherein inherent data required for controlling an automatic insertion machine for inserting electronic parts into printed circuit boards are recorded by punching a tape.

In general, automatic insertion machines for inserting electronic parts (resistors, capacitors and so on) into printed circuit boards incorporate a numerical control system. In general numerical control data used with the automatic insertion machines include data of positions to be inserted and inherent data required for the control of an insertion machine such as data for selection of types of parts to be inserted and data for designating the insertion directions on a printed circuit board. Of these data, data concerning the insertion positions are obtained when a printed circuit board is designed. In practice, elongation and shrinkage after the step for punching apertures in printed circuit boards is not negligible. Therefore, the part insertion hole positions must be directly measured from a printed circuit board to be used, and dimensional data must be obtained in the form of X coordinate and Y coordinate.

So far a printed circuit board to be measured is set on an X-Y table with pulse motors of an automatic insertion machine; a numerical control device or the like incorporated within the insertion machine itself is operated so that object insertion apertures of the printed circuit board may be in coincidence with the centers of leading ends of an insertion head which are references; and the displacement data are obtained by reading with a counter a number of oscillation pulses of pulse motors. Based on thus obtained data, an operator operates keys on a typewriter coupled to a puncher available in the market so that tape is punched and a numerical control tape is prepared.

The above prior method has the following defects:
  (1) In case of measurement of positioning data, the insertion machine must be temporarily stopped so that the rate of machine operation drops.
  (2) An operator must visually observe the degree of alignment between an insertion aperture of the printed circuit board and the leading end of the machine insertion head, thereby judging the positioning conditions. Therefore correct positioning is difficult so that data required for preparation of correct positioning tape cannot be obtained.
  (3) Reconfirmation of the positioning conditions with the positioning tape is difficult. In order to correct positioning data, a new punch tape must be provided again.

Next the method consisting of the combination of a general coordinate reader employing an X-Y table and a typewriter type tape puncher device has the following problems:
  (1) When the center position of a part insertion aperture is to be correctly aligned or positioned, with a projector type an image is not clear so that it is difficult to view a profile of the aperture. With a probe stylus type and a printed circuit board or the like, the latter is damaged. Furthermore workability is poor.
  (2) When a printed circuit board is mounted on the X-Y table, there is no relationship with a printed circuit board mounting system employed in the part insertion machine so that a numerical control tape as prepared cannot be used with the part insertion machine.
  (3) There is not provided a monitor which displays all of codes used in the program for the part insertion machine. Therefore prior to the punch-out or print-out of the prepared program, mistakes cannot be checked and corrected.
  (4) An operation unit for positioning a printed circuit board and peripheral data-out equipment such as a tape puncher, a tape reader, a printer and so on are independent of and separated from each other so that they cannot be simultaneously operated. As a consequence, operability is poor, and they are large in size and expensive.

Therefore this method is inconvenient to an electronic part automatic insertion machine which must prepare punch tapes very frequently in order to meet the change of one type printed circuit boards to another type and the change in insertion positions.

SUMMARY OF THE INVENTION

Accordingly, it is an object of the present invention to display on enlarged scale an object to be measured which is mounted on a table with a television camera unit and a monitoring television receiver so that the correct positioning of said table may be accomplished, the displacement of said table may be correctly obtained, the displacement is recorded on a numerical control tape and information may be correctly recorded on a numerical control tape.

It is another object of the present invention to sequentially store the displacements of the table in a memory means so that based on the information stored in the memory means, said stored information may be all recorded on a numerical control tape, whereby rapid recording operation is effected.

It a further object of the present invention to provide an illumination device for illuminating a part of an object to be measured which is picked up by a television camera unit so that the confirmation of a position on the object to be measured with a monitoring television receiver is facilitated.

It is a further object of the present invention to provide a spot-light illumination device, in addition to said illumination device for illuminating the whole part of the object to be measured which is picked up by the television camera, to intensively illuminate an arbitarily selected spot in said part so that in case of the positioning of the object to be measured, the part to be measured of the object to be measured may be displaced relative to the spot-light position and then the operator may watch the monitoring television receiver for precise positioning, whereby a rapid measurement operation may be accomplished.

It is a further object of the present invention to provide a lens having crossed and graduated lines and mounted in the image focusing position through an object lens mounted in the television camera unit so that the monitoring television receiver may simultaneously display the object to be measured and the crossed and graduated lines and consequently the operator may manually displace the object to be measured while watching the monitoring television receiver, whereby correct table positioning may be attained and consequently the correct displacement of the table may be obtained.

It is a further object of the present invention to store in the memory means the sequential displacements of said table when the displacements of the table upon which is mounted the object to be measured are recorded on a numerical control tape, so that the said table may be driven based on the information stored in the memory means, the displacement position of this table may be confirmed with the monitoring television receiver and correct information may be recorded on the numerical control tape after the information in said memory means have been checked.

It is a still another object of the present invention to displace the table upon which is mounted the object to be measured based on the information recorded on the numerical control tape and to confirm the displacements of this table with the monitoring television receiver, whereby the information recorded on the numerical control tape may be checked.

It is a still another object of the present invention to vary the distance between the image focusing position through the objective lens mounted in the television camera and an eyepiece so that the magnification of the object to be measured which is displayed on the monitoring television receiver may be freely varied, whereby the measurement of the object may be facilitated.

It is a yet another object of the present invention to use a printed circuit board as an object to be measured, to store in the memory means the types of electronic parts to be inserted into predetermined apertures of the printed circuit board in addition to the displacements of the printed circuit board, and to record these data on a numerical control tape, whereby data for automatic insertion of desired electronic parts at desired positions may be recorded on the numerical control tape.

It is a yet further object of the present invention to provide means for correcting the information stored in the memory means so that the information stored in the memory means may be checked and corrected and then the information in said memory means may be recorded on a numerical control tape, whereby the recording of information on the numerical control tape may be accomplished quickly and correctly.

Briefly stated, the present invention comprises a table upon which may be mounted an object to be measured and which may be movable along two axes perpendicular to each other, drive motors for driving said table along said two axes, a memory means for storing the displacement of said table driven by said drive motors, a television camera unit mounted at right angles to said table, a monitoring television receiver for receiving the video signal from said television camera and displaying on enlarged scale, a recording means for recording the information stored in said memory means on a numerical control tape based upon said information, and an manual operation unit for controlling the drives of said drive motors.

BRIEF DESCRIPTION OF THE DRAWINGS

FIG. 6 shows an X-Y table and its drive and control units.

DESCRIPTION OF THE PREFERRED EMBODIMENT

Figure 1:
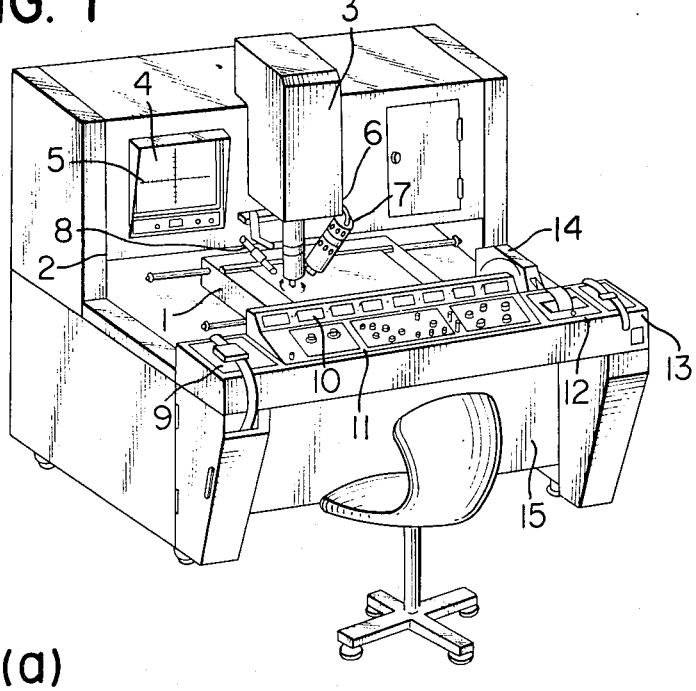
FIG. 1 is a perspective view of a preferred embodiment of a numerical control tape preparation machine in accordance with the present invention.

FIG. 1 shows a perspective view of an embodiment of a device in accordance with the present invention. 1 is an X-Y table movable mutually perpendicular axes (X, Y) or lead screws 55 and 59 on a horizontal plane, and the lead screws 55 and 59 are provided with driving pulse motors 54 and 58 (See FIG. 6). 2 is an object to be measured (to be referred to as "a printed circuit board" in this embodiment) which is set upon the above table 1. 3 is a television camera installed vertically above the X-Y table, and in FIG. 1 the camera is shown as being located inside a cover. 4 is a monitoring television receiver (to be referred to as a television monitor in this embodiment) operatively connected to the television camera 3. 5 is mutually perpendicular positioning reference lines (to be referred to as "a cross hairs" in this embodiment) which is projected as an image on a monitor face. 6 is a cross hairs optical system directly joined to a mount of the television camera 3. 7 is an illumination source for television camera 3. 8 is a spot-light. 9 is a tape reader for transferring tape data into a memory in the device. 10 is a counter. 11 is an operation board. 12 is a printer for taking out printed sheet. 13 is a taper puncher for preparing punched tape. 14 is a tape reel storage. 15 is a main frame which houses control unit (microcomputer) of the device consisting of a numerical control drive unit 15a, a data storage unit 15b and a control circuit 15c. The control unit is not shown in FIG. 1 because a cover is closed.

Next the general mode of tape preparation with the device in accordance with the present invention will be described.

An operator sits in front of the operation board and mounts upon the X-Y displacement table 1 the printed circuit board 2 having apertures into which are inserted parts in a predetermined sequence. Next the operator operates push buttons of displacement switches (X⊕, X⊖, Y⊕ and Y⊖) on the table 1 to select object insertion apertures in a predetermined part insertion sequence and to displace the table 1 in such a manner that the intersection of the cross hairs 5 may coincide with the midpoint between a pair of insertion holes spaced apart from each other by a predetermined pitch. The operator may view the images of insertion holes, enlarged by approximately 10 times, of the printed circuit board 2 on the television monitor 4, and the insertion apertures are monitored by the television camera 3 immediately above them so that the operator may correctly position the insertion apertures with respect to the cross hairs 5. The displacement of the table 1 is continued as long as the operator keeps pushing the push button. The operator may selects a rapid traverse or a high-speed continuous displacement (150 mm/sec) and a fine adjustment or an incremental displacement which corresponds to one step (0.05 mm) of the pulse motor 54 or 58 in response to one push of the push button. Therefore the operator may continuously displace the object insertion holes at a high speed to the vicinity of the cross hairs 5, and then may displace the table 1 step by step until the midpoint between the pair of adjacent insertion apertures may correctly coincide with the intersection of the cross hairs 5. In this embodiment, the unit of the X and Y counters is 0.01 mm. That is, when the reading of the X or Y counter is 1000, it means 10 mm.

This displacement or the end position may be measured from the origin or the reference point "0" of the X-Y table 1 or from the midpoint of the pair of insertion apertures which has been already measured in the previous positioning step. The coorinates of the insertion aperture position are stored in the memory in the device. In like manner the positioning cycle is repeated so that all numerical control data required for one printed circuit board 2 are stored. Next the data stored are read out sequentially, and the control on the rotations of the pulse motors is effected in response to numerical control data so that the positioning of the X-Y table is accomplished. The operator may confirm whether or not the numerical control data are correct by viewing the relative position between the cross hairs 5 and the images of the positions of the apertures of the printed circuit board focused on the television monitor while the above automatic positioning is carried on.

After having confirmed the correct positioning sequence, the operator operates push button switches (numerical keys, symbol keys and so on) provided exclusively for entering numerical control positioning data so that types of parts to be inserted and insertion directions (X or Y directions) may be additionally stored. These information data may be visually confirmed by operating a data read switch so as to display them on a predetermined display device on a monitor board.

After having programmed the numerical control tape data in the manner described above, the operator operates the puncher to read the program in the memory and to punch a tape, thereby preparing a punched tape. In like manner, the operator may operate the printer so as to obtain a printed sheet.

Information stored in the memory 15b may be transfered to the numerical control drive unit 15a, and in response to the outputs from this numerical control drive unit 15a the drive motors 54 and 58 are driven for rotating the X- and Y- lead screws 55 and 59 and thereby displacing the X-Y table according to the stored information. The operator may confirm the displacement of the X-Y table 1 with the television monitor 4 as well as the types of parts to be inserted and the directions of insertion by the monitor board, whereby the operator may check information stored in the memory 15b. Means is provided so that when the operator finds erratically stored information, he or she may measure again so as to store correct information.

Referring particularly to FIG. 6, the construction of the X-Y table 1 will be briefly described. The X-Y table 1 has an upper table 52 and a lower table 56, and the printed circuit board is mounted on the upper table 52. Two parallel guide rails are mounted on the upper surface of the lower table, and the upper table 52 is mounted on these guide rails 53 for movement in the X-direction. Attached to the upper table 52 is a nut threadably fitted over the X lead screw 55 which is rotated by the X-axis pulse motor 54 mounted on the lower table 56. The lower table 56 is mounted for slidable movement in the Y-direction on two parallel guide rails 57 mounted on the main frame, and attached to the lower table 56 is a nut through which passes the Y-axis lead screw 59 which is rotated by the Y-axis pulse motor 58 mounted on the main frame.

Therefore upon rotation of the pulse motors 58, the upper table 52 is displaced in the Y-direction in unison with the lower table, and upon rotation of the pulse motor 58 the upper table 52 is displaced in the X-direction.

The tape reader reads the numerical control tape and stores the data on it into the memory in the device. Data stored in the memory 15b are transferred to the numerical control drive unit 15a, and in response to the outputs from the numerical control drive unit 15a the X-axis drive motor 54 and the Y-axis drive motor 58 are driven so that the X-Y table 1 is displaced. Therefore the operator may confirm whether or not the positioning data are correct, and read other information data from the monitor board.

With the device in accordance with the present invention, edition, modification and so on of contents in the program may be effected in case of data input and output so that a required numerical control tape may be easily prepared.

Figure 2A:
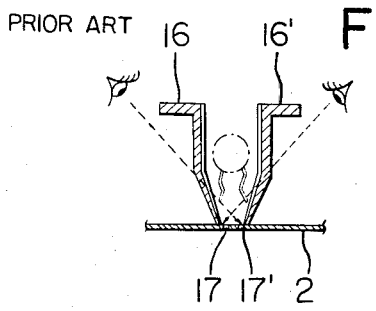
FIG. 2(a) is a sectional view of the leading end portion of an insertion head used for the explanation of a prior art positioning method.
Figure 2B:
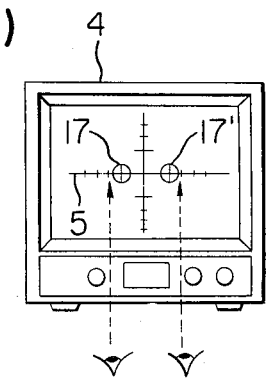
FIG. 2(b) is a front view of a monitoring television receiver used in the embodiment of the tape preparation machine in accordance with the present invention.
Figure 2C:
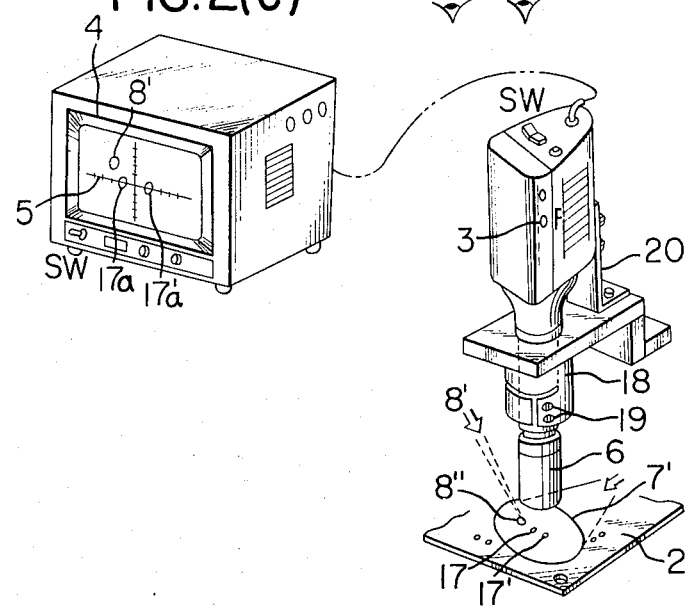
FIG. 2(c) is a perspective view of the monitoring television receiver and a television camera.

FIG. 2 shows the underlying principle of the positioning method. 16 and 16' in FIG. 2(a) are leading ends of an insertion head of an insertion machine, and FIG. 2(a) shows a prior art positioning method wherein these leading ends 16 and 16' are aligned with a pair of lead wire insertion apertures 17 and 17' in the printed circuit board 2. FIG. 2(b) shows a novel method of the present invention wherein the operator watches the television monitor and causes the X-Y table 1 to move in the manner described above so that the enlarged images of insertion holes 17 and 17' may be positioned with respect to the reference lines or the cross hairs 5. FIG. 2(c) schematically shows the images. 17a and 17a' are a pair of part insertion apertures in the printed circuit board 2 imaged on a cathode-ray tube. 7' is an illumination light ray from an illumination source 7. 8' is an illumination light ray from the spot-light 8. 8" is a spot-light the printed circuit board. 18 is a bracket with which the cross hairs optical system 6 is mounted. 19 is a bolt for securely holding in position the optical system inserted into a hole formed in a boss portion of the bracket 18. 20 is a bracket with which is mounted the television camera 3 coupled to the upper portion of the optical system. 4 is the television monitor connected to the camera and displaying the cross hairs 5, insertion holes 17 and 17' and the spot-light 8" all enlarged by 10 times in the present embodiment. The axis of the television camera 3 is in line with the intersection of the cross hairs. The spot-light source is so adjusted that the spot-light 8" is projected in the vicinity of the cross hairs intersection. Therefore when the object insertion holes 17 and 17' are aligned with the cross hairs 5, the operator may displace the X-Y table 1 in such a way that the spot-light 8" may approach to the vicinity of the insertion apertures 17 and 17'. Thus the insertion apertures 17 and 17' may be very conveniently and easily aligned with the center portion of the television image.

Figure 3A:
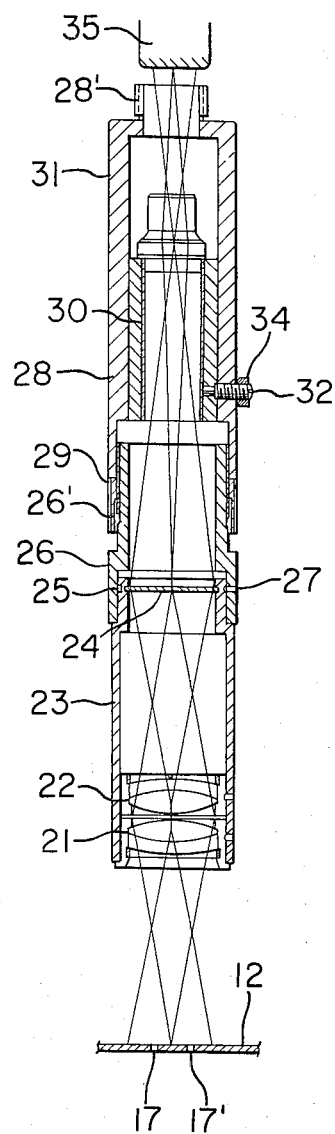
FIGS. 3(a) and (b) are detailed sectional and front views of a cross-hairs optical system.
Figure 3B:
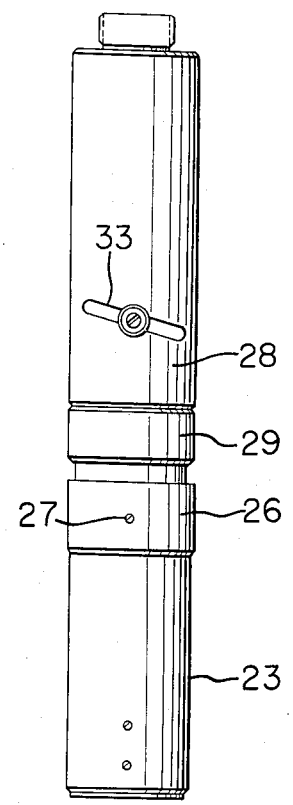

FIG. 3 is a detailed view of the cross hairs optical system described above. In FIG. 3, 21 and 22 constitute a relay lens system consisting of two pairs of convex and concave lenses mounted at the leading end portion of a hollow tube 23. 24 is a cross hairs reticule mounted at the other end. 25 is a V groove formed in the outer surface of a stepped connection portion of the tube 23. 26 is an intermediate tube connected to the tube 23 and provided with three setting screws 27 on the outer periphery of the connection portion. The leading end of the setting screw 27 is in the form mating with the V groove 25 so that the tube 23 may be stopped at any position on the rotation circle. Therefore the adjustment may be effected in a simple manner such that the axes of the cross hairs are correctly aligned with the horizontal and vertical directions on the television monitor. 26' is a threaded portion at one end of the intermediate tube 26. 28 is another hollow tube connected to the threaded portion 26' of the intermediate tube 26. 28' is a stepped and threaded portion at the other end of the tube 28 which is connected to the C mount of the television camera. 29 is a nut for holding the joint between the intermediate tube 26 and the hollow tube 28.

30 is an inner tube slidably fitted into the hollow tube 28, and an objective 31 is connected to one end of the inner tube with a screw. 32 is a stepped pin having threaded portions at both ends. One end is connected to the outer peripheral of the inner tube 30 while the other end is fitted into an inclined groove 33 formed in the outer peripheral surface of the hollow tube 28. 34 is a nut for holding in position the pin 32. Because of the above described construction, optical images of insertion holes 17 and 17' in the printed circuit board 2 placed in the focal plane of the lens 21 passes the relay lenses 21 and 22 at the leading end of the tube 23 and are focused as inverted images of the same size on the cross hairs reticule 24 placed in the focal plane of the lens 22. The composite or the superimposed images of the subjects and the cross hairs 5 pass through the objective lens 31 and are focused on the screen or a face or signal plate 35 of a television camera tube. In this case, the electric magnification of image is calculated which is dependent upon the ratio between the effective area of the television camera tube and the effective area of the cathode-ray tube. Thereafter in order to attain a desired overall magnification of image on the cathode-ray tube, the distance between the subject and the television camera tube is adjusted by the screw joint between the intermediate tube 26 and the hollow tube 28. Focusing is effected by the displacement of the pin 32 which causes the displacement of the object lens 31.

Figure 4A:
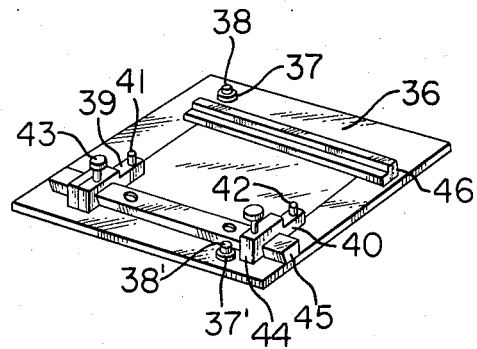
FIGS. 4 and 5 show different systems for holding printed circuit boards, (a) being perspective view and (b) being longitudinal sectional views.
Figure 4B:
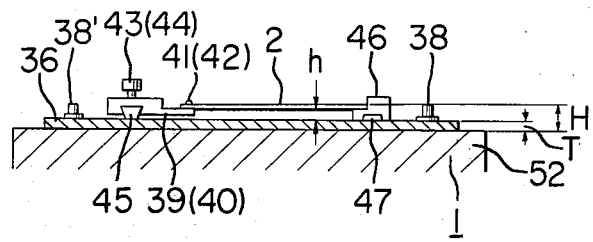
Figure 5A:
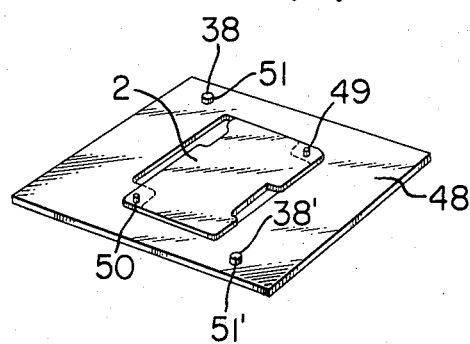
Figure 5B:
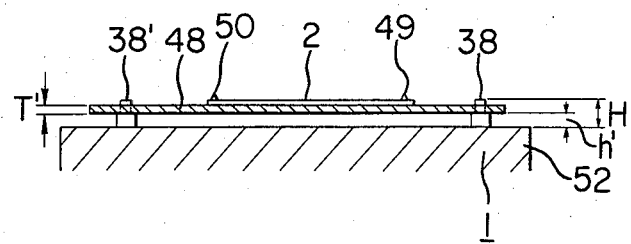

FIG. 4 and FIG. 5 show methods of the present invention for mounting on the X-Y table the printed circuit board which is an object to be measured in this embodiment. Depending upon the configurations of the printed circuit boards and the characteristics of insertion machines, various types of printed circuit board mounting methods are available. And those shown in FIGS. 4 and 5 are typical ones. In FIG. 4, 36 is a plate, and 37 and 37' are positioning holes drilled or otherwise formed in the plate in opposed diagonal relationship with each other. 38 and 38' are stepped pins embedded in the upper surface of the X-Y table 1 with a pitch corresponding to the plate positioning hole pitch. The leading portion of the stepped pin has a small diameter while the root portion has a large diameter. 39 and 40 are levers. 41 and 42 are printed circuit board positioning pins at the leading ends of the levers. 43 and 44 are lever clamping screws. 45 a slide guide for displacement of the lever. 46 is a receiving stand for supporting the other end of the printed circuit board. 47 is a magnet embedded in the undersurface of the receiving stand 46 for holding the receiving stand at any position on the plate 36. In this figure, the printed circuit board 2 is shown as being floating at a height h above the plate 36, but since the positioning holes 37 and 37' of the plate 36 are equal to the large diameter of the positioning pins 38 and 38', the plate 36 is placed on the table 1 and the height to the upper surface of the printed circuit board 2 is H.

FIG. 5 shows a printed circuit holding plate the system of which is different from that shown in FIG. 4. 48 is a main body of a plate. 51 and 51' are positioning holes formed in the plate in opposite diagonal relationship with each other. 49 and 50 are printed circuit board positioning pins embedded in the plate 48 itself. In this figure, the printed circuit plate 2 is shown as being very closely attached to the plate 48, but since the diameter of the positioning holes 51 and 51' of the plate 48 is equal to the small diameter of the leading end portions of the positioning pins 38 and 38', the plate 48 is held at the stepped portions of the positioning pins 38 and 38'. As a result, the height from the upper surface of the table 1 to the upper surface of the printed circuit board 2 is H'. Therefore when the thickness T and T' of the plate 36 shown in FIG. 4 and of the plate 48 shown in FIG. 5 are made equal and when the height of the printed circuit board 2 above the plate 36 shown in FIG. 4 is made equal to the height h' to the stepped portions of the stepped positioning pins, H=H'; that is, the heights to the upper surfaces of the printed circuit boards are equal.

Therefore whether the printed circuit plate is mounted on the printed circuit board holding plate shown in FIG. 4 or 5 depending upon the configuration of the printed circuit board and characteristics of the insertion machine, the height to the upper surface of the printed circuit board is coplanar. Therefore in case of the exchange, the adjustment in magnification, focusing and so on of the television camera may be eliminated so that very great effects may be attained.

As described in detail in the above embodiment, according to the device for preparing a numerical control tape in accordance with the present invention, memory means is provided which measures the displacement of the table movable in two directions mutually perpendicular to each other and stores this displacement. As a result, in case of the measurement of positioning data, it is not needed to stop the part insertion machine every time the measurement is made. That is, the positioning data measurement may be effected while the operation is continued. Therefore the rate of operation may be improved. The judgement of the conditions under which the positioning of part insertion holes or the like is made by the operator who may view enlarged objects such as part insertion holes on the television monitor. Therefore workability may be improved, the operator feels no fatigue, the correct positioning is effected, a numerical control tape having recorded thereon correct positioning information may be obtained. Furthermore not only the device of the present invention may be used for preparing numerical control tapes but also the numerical control tape thus prepared may be used for operating and controlling a machine such as a part insertion machine. The reconfirmation of the positioning conditions may be easily made, and the correction of positioning data may be also made easily.

The numerical control tape preparation machine of the present invention has a lens having crossed horizontal and vertical lines inserted in the focal position of the lens of a television camera so that the crossed and graduated scale lines and the objects are simultaneously viewed on the television monitor. Therefore positioning may be effected correctly and easily.

Furthermore a spot-light is used to focus a dot-like projected light mark on an object so that positioning control may be effected easily.

What is claimed is:

1. A numerical control tape preparation machine comprising:

a table upon which may be mounted an apertured printed circuit board wherein the locations of apertures therein are to be measured, said table being movable in two axial directions mutually perpendicular to each other and in an aperture viewing plane parallel to the table surface;

drive motors for driving said table along said two axes;

memory means for storing the displacement of said table along said axes;

a television camera unit installed at right angles relative to said table for receiving light reflected from said object to be measured, said camera unit having an optical system including an objective lens and a reticule having crossed and graduated lines and rotatably mounted in an image focusing plane of said objective lens, said image focusing plane being parallel to said aperture viewing plane and an eyepiece for simultaneously converting said printed circuit board apertures and said crossed and graduated lines into images;

an illumination device for directing/light toward said table surface to illuminate a part of said object to be measured;

a monitoring television receiver coupled to said television camera unit for displaying at least a portion of said apertured printed circuit board to be measured on an enlarged scale;

recording means for recording on a numerical control tape the information in said memory means based on said information; and a manually operable unit for controlling the drives of said drive motors, said illumination device comprising (i) a light source for illuminating the entire portion of said apertured printed circuit board to be measured which is displayed on said monitoring television receiver and (ii) a spot-light illumination means for simultaneously and intensely illuminating a desired region with a dot-like spot within said entire portion of said apertured printed circuit board which is displayed on said monitoring television camera.

2. A numerical control tape preparation machine as set forth in claim 1 wherein the upper surface of said table is formed with two positioning pins in opposite diagonal relationship with each other, each positioning pin having a small diameter leading end and a large diameter root, a stepped portion being formed between the small diameter portion and the large diameter portion.

3. A numerical control tape preparation machine as set forth in claim 1 wherein said television camera unit is provided with an objective lens in opposed relationship with said apertured printed circuit board to be measured, said objective lens being so arranged as to permit a change in size between said focusing plane through said objective lens and the eyepiece.

4. A numerical control tape preparation machine as set forth in claim 1 wherein said first television camera unit has a first lens mounted at the leading end in opposed relation with said apertured printed circuit board to be measured.

5. A numerical control tape preparation machine as set forth in claim 4 wherein said lens mounted at said leading end of said television camera is formed of two pairs of convex and concave lenses, and said reticule having crossed and graduated lines is placed at the focal point position of the rear pair of said two pairs of convex and concave lenses.

* * * * *

UNITED STATES PATENT AND TRADEMARK OFFICE
CERTIFICATE OF CORRECTION

PATENT NO. : 4,232,335
DATED : November 4, 1980
INVENTOR(S) : Hiroshi Nakagawa, et al It is certified that error appears in the above—identified patent and that said Letters Patent is hereby corrected as shown below:

Column 2, line 40: After "It" insert --is--.

Column 4, line 37: "taper" should read --tape--.

line 66: "selects" should read --select--.

Column 8, line 55: "fatigure" should read --fatigue--.

Signed and Sealed this

Sixteenth Day of June 1981

[SEAL]

Attest:

RENE D. TEGTMEYER

Attesting Officer     Acting Commissioner of Patents and Trademarks